PROCESS FOR THE MANUFACTURE OF PRINTING PLATES AND LIGHT-SENSITIVE MATERIAL SUITABLE FOR USE THEREIN
Filed Feb. 14, 1958
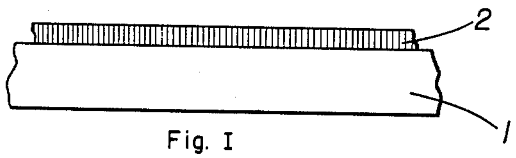
Fig. I
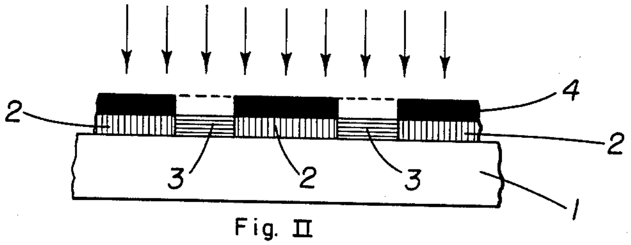
Fig. II
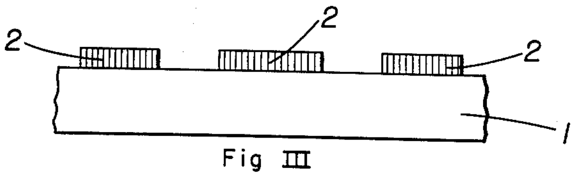
Fig III
Inventor
MAXIMILIAN P. SCHMIDT
By Karl Huber
James E. Bryan
Attorneys 3,046,121

PROCESS FOR THE MANUFACTURE OF PRINTING PLATES AND LIGHT-SENSITIVE MATERIAL SUITABLE FOR USE THEREIN

Maximilian Paul Schmidt, Wiesbaden-Biebrich, Germany, assignor, by mesne assignments, to Azoplate Corporation, Murray Hill, N.J.

Filed Feb. 14, 1958, Ser. No. 715,443
Claims priority, application Germany July 23, 1949
42 Claims. (Cl. 96—33)

The present invention relates to the production of light-sensitive materials suitable for use in the graphic art. More particularly, it relates to a photomechanical method for the manufacture of printing plates and to light-sensitive material suitable for use in the said method.

It has often been proposed to use light-sensitive diazo compounds for the manufacture of copies suitable for the production of reproductions in the graphic art. One of these methods is characterized by the following features: A thin coating comprising colloidal substances in combination with the light sensitive diazo compounds is produced on a suitable support (carrier base) and, after the coating has been exposed to light under a pattern, the material is transformed into a printing plate suitable for intaglio printing and flat printing respectively just in the same manner as chromate containing layers. In another method the colloidal substances are omitted and the diazo compounds, chiefly water-soluble diazo compounds, are applied to a suitable support either alone or in combination with azo components. Supports which can be used in the above mentioned methods of manufacture are, for example, metal foils, such as foils of aluminium, of aluminium superficially oxydized, and of zinc.

Water-soluble diazo compounds of high molecular weight have proved themselves particularly suited for a negative working process. On exposure to light under a pattern all areas of the light-sensitive layer struck by light rays are transformed into greasy ink receptive products insoluble in water. Immediately after washing the copies thus obtained with water, prints can be made by means of these copies.

If it is intended to produce with the aid of a positive working process copies suitable for making prints, diazo compounds are used which are not so complicated, as to their chemical constitution, as the above mentioned diazo compounds. For example, p-N-dimethylamino-benzene-diazonium salts can be used in combination or not with an azo component. Whereas the exposed material in the above mentioned negative-working process must only be washed, the copies obtained in the positively working process are treated with an alkali, such as ammonia, or with a suitable alkaline developer containing the coupler, if the coupling component has not yet been incorporated into the light-sensitive layer.

In Example 7 of the French Patent 904,255 a process has been described in which 2-diazo-naphthol-(1)-5-sulfonic acid ethyl ester has been used as light-sensitive substance, the development of the exposed layer being effected by means of water. This process, however, does not afford usable printing plates.

One subject of the present invention is a process for the manufacture of copies which, in the first line and with outstanding advantage, are intended to be used as printing plates in the graphic art. The new process comprises the following steps:

A suitable support (carrier base) is provided with a light-sensitive coating using as substances causing the light-sensitivity diazo compounds which are derivatives of 2-diazo-naphthol-(1) and 1-diazo-naphthol-(2) and are formed by esterification of a sulfonic acid of the above mentioned diazo-naphthols.

The light-sensitive layer thus produced is exposed to light under a pattern, the exposed layer is treated with an alkali and then rubbed in with greasy ink.

Often it may be advantageous to rewash the printing plate already rubbed in with greasy ink with an alkaline solution.

The compounds heretofore named 2-diazo-naphthol-(1) and 1-diazo-naphthol-(2) are also known in the literature under the designations of naphthoquinone-(1,2)-diazide-(2) and naphthoquinone-(1,2)-diazide-(1) (see Beilstein, "Handbuch der organischen Chemie," 4th edition, volume 16 (1933), pages 533–534). Diazonaphthols are to be considered as the anhydrides of hydroxynaphthalene-diazohydroxides; see Beilstein loc. cit., page 526.

The diazo compounds which are to be used according to this invention for the production of the light-sensitive coating on the support are insoluble in water, weak alkalis and acids; they are soluble in certain organic solvents or in mixtures of organic solvents. If the diazo compounds in question are struck by light, they are transformed into substances (light-decomposition products) which dissolve in an aqueous medium having alkaline reaction.

The coating which has been exposed to light under a pattern is treated with alkaline solutions, because the light-decomposition products produced in the course of the exposure are to be removed. Suitable supports on which the light sensitive coating can be applied are, for example, the members of the group consisting of metal foils or metal plates, particularly such of zinc, or aluminum, glass plates and stone plates.

The process of the present invention as described above leads to printing plates on which the areas which have not been struck by light during the exposure of the light sensitive coating under a transparent pattern and correspond with the density areas of the pattern are not changed by the treatment with alkali; the unaltered areas are receptive for greasy ink. The terms "imaged areas" and "non-imaged areas" are used hereinafter to refer to those areas of the coating layer which are not struck by light and those areas which are struck by light, respectively. Thus, the "imaged areas" are those areas of the coating layer protected from light during exposure by the density areas of the pattern.

From this circumstance it is to be seen that on exposure under a positive pattern a positive printing plate is obtained from which positive prints may be drawn, whereas from an exposure under a negative pattern negative printing plates result and likewise negative prints can be made. The invention is illustrated by the accompanying figures:

FIG. 1 represents the support 1 which is covered by the light-sensitive layer 2, FIG. 2 shows the material represented in FIG. 1, after it has been exposed to light under a pattern. 1 designates the support, 4 the density areas of the pattern. The areas of the light sensitive layer which have not been struck by light and are unchanged—i.e. the imaged areas—have been numbered by 2, whereas the number 3 designates the areas of the formerly light-sensitive layer which have been struck by light and in which the diazo compound has been transformed into a light-decomposition product—(i.e. the non-imaged areas).

FIG. 3 illustrates the exposed material as shown in FIG. 2 after it has been treated with alkali. The support 1 is only covered by the imaged areas 2 not struck by light during the exposure. These areas designated by the number 2 are greasy ink receptive and form, together with the support, the printing plate.

The advantages of the present invention are elucidated by the following facts: The composition of the light-sensitive layers as well as of the light-sensitive material is very simple, the light-sensitive layers are positively working ones, their development to the final stage (printing plates) is likewise very simple. In the necessary development azo coupling components are superfluous.

Diazo compounds suitable for the purposes of the present invention are esters of diazonaphthosulfonic acids having the formula

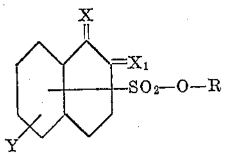

in which X and $X_1$ are $N_2$ or O and are different from each other, Y is hydrogen or halogen and R is a substituted or unsubstituted aryl or heterocyclic radical.

The following compounds which are referred to in the following examples represent diazo compounds which are useful according to the present invention.

(1)

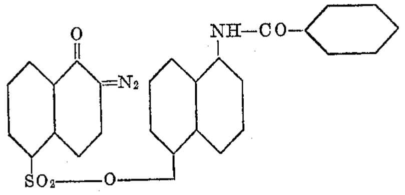

(2)

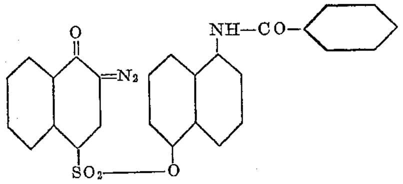

(3)

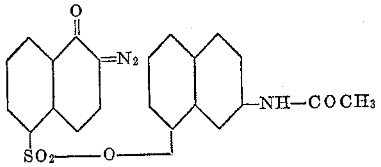

(4)

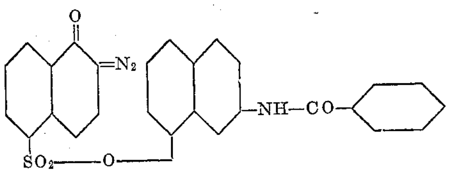

(5)

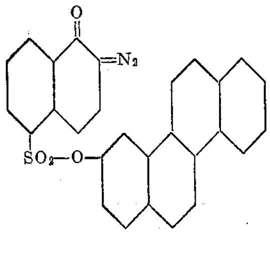

(6)

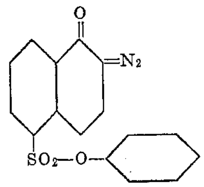

(7)

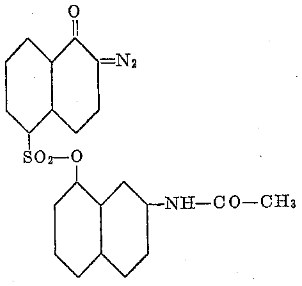

(8)

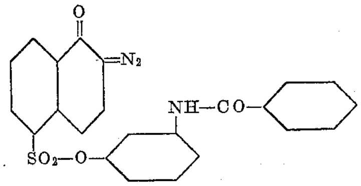

(9)

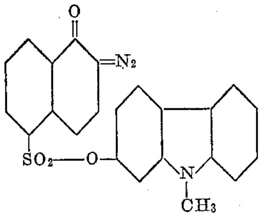

(10)

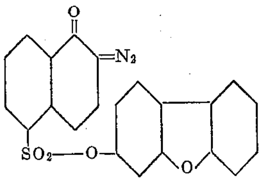

(11)

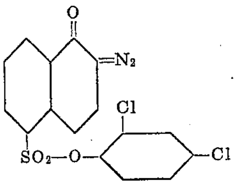

(12)

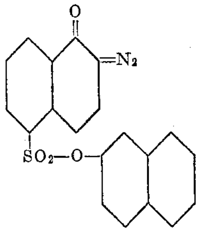

(13)

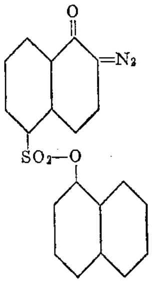

(14)

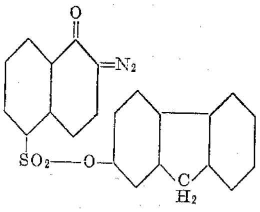

(15)

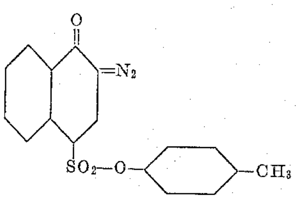

(16)

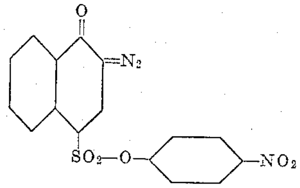

(17)

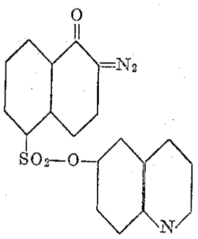

(18)

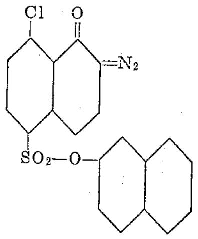

(19)

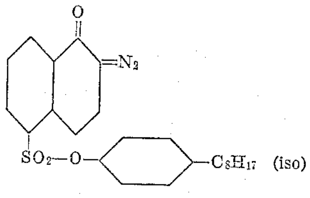

(20)

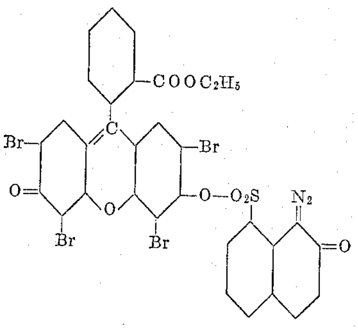

Most of the diazo compounds to be used according to this invention have not been described in the literature until now. They can be prepared without difficulty according to well-known methods of chemical synthesis, for example by reacting the chlorides of sulfonic acids of 2-diazo-naphthol-(1) and 1-diazo-naphthol-(2) respectively with organic hydroxy compounds. Thus, aromatic hydroxy compounds which may be substituted in the nucleus by halogen atoms or by alkyl or alkoxy or aryloxy or alkylmercapto or aryl-mercapto or nitro or acyl-amino groups or may be hydrogenated are condensed with the sulfochlorides of the 2-diazo-naphthol-(1)-sulfonic acids and the 1-diazo-naphthol-(2)-sulfonic acids respectively. The sulfochlorides in question are readily obtainable by causing chlorosulfonic acid to act upon the above named diazo-naphthol-sulfonic acids at about 50 to 70° C. Suitable hydroxy-compounds are, for example, the phenols, naphthols, 1-nitro-2-naphthol, N-benzoyl-p-aminophenol, N-acetyl- or N-benzoyl-1,5- or -2,8-amino-naphthol, the hydroxyphenanthrenes, 2-hydroxychrysene, and even compounds of dyestufflike character, such as 1- or 2-hydroxyanthraquinone. The condensation of the components is effected advantageously in an aqueous weakly alkaline solution containing soda or a caustic alkali. For this purpose the alkaline substance is graually added to the mixture of the diazo sulfochlorides with the hydroxy compounds. Sometimes it is advisable to add a suitable organic solvent.

Generally speaking the bigger the molecules of the hydroxy compounds condensed with the diazo-naphthol-sulfonic acid chloride are, the better suited for the purpose of the present invention are the sulfonic acid esters obtained.

In fact the high-molecular diazo compounds according to the present invention fade better under the influence of light, untinted printing plates being the result. The fading of the diazo compounds can be promoted by the cautious addition of suitable substances to the light-sensitive layer, such as thiourea, thiozinamine and organic acids or dyestuffs having a sensitizing action or improving the visibility of the images can also be added. It will be worthwhile to disregard the use of diazo compounds which do not readily fade.

For the production of the light sensitive material the diazo compound dissolved in an organic solvent, such as benzene or alcohol, is applied onto a support, for example a superficially oxidized aluminium foil, a thin layer being formed. It is important to produce a uniform and even light-sensitive layer of the diazo compounds on the layer and this can be realized advantageously by using solvents or mixtures of solvents which do not vaporize in a short time. Occasionally very good results as to the production of an uninterrupted strongly coherent layer very well sticking to the support are obtained by using a mixture of several different diazo compounds. Solutions which contain 1 to 3 percent of the diazo compounds are satisfactory for the manufacture of the light sensitive layer.

The copies which have been obtained by the exposure to light of the coated material under a pattern are developed by means of alkaline solutions as much diluted as possible. Generally aqueous solutions containing 1 to 5 percent of disodium phosphate and trisodium phosphate respectively will be suited. Instead of them dilute solutions of other alkalies, such as soda or caustic soda, can often also be used and solvents, such as alcohol, can be added, if desired. The following data will enable any expert to comply with the requirements of practice: diazo-naphthol-sulfonic acid esters can be developed with solutions of trisodium phosphate. As a rule the weakest alkali suitable for removing the light-decomposition products of the diazo compound should be used. The diazo compounds can be protected against actions coming from the developing alkaline solution by adding readily soluble alkali metal salts, such as sodium chloride, sodium bromide, and sodium sulfate to the developer.

The diazo compound images which have been developed on a metal or glass or stone support can be etched by means of acids, even after the images have been rubbed in with greasy ink. In this manner relief printing plates too can be produced.

Another object of the present invention consists in a modification of the above described process. This modification often leads to an improvement of the diazo compounds' power of fixing greasy inks and to an increase of the number of prints which can be produced by means of the printing plates obtained. The modification is characterized by the feature that the light sensitive diazo compounds are coated onto the support in combination with resins soluble in alkalines or with solid fatty acids or mixtures of resins and fatty acids. Suitable products of this kind are, for example, the resins soluble in alkalies, such as colophony, shellac, and the synthetic resins soluble in alkalies. Small quantities of waxes, dyestuffs or resins insoluble in alkalies can be added. The fatty acids suited for the purpose of this invention must be solid and high molecular, such for example as stearic acid.

The quantity of resin and solid fatty acid respectively which is added to the diazo compounds may vary in rather wide limits. Already a quantity amounting to 5 to 10 percent of the quantity of the diazo compound used is very effective. The quantity which is actually added depends on the special diazo compound used for the production of the light sensitive layer.

This modification of the invention as described is accessible to another modification which shall be explained as follows:

The support (carrier base) before being coated with the solution of the light sensitive diazo compound is covered with a layer which is produced using resins soluble in alkalies or fatty acids or synthetic resins with or without a small addition of waxes or dyestuffs or resins insoluble in alkalies. The diazo compound solution is then applied onto this layer and, after drying, the light sensitive material is proceeded with as described above. After the exposure to light the material is developed by means of an aqueous alkaline solution in order to remove the light-decomposition products of the diazo compound and now at all areas struck by light also the layer which had been applied as the base layer is removed. The base layer, however, remains unchanged in all areas not struck by light, i.e. in the areas forming the image. Using the images thus obtained as printing plates in the graphic art, excellent results can be reached. Often the results can still be improved, if the material, after it has been exposed to light under a pattern, is subjected to a heat treatment or if it is heated, after the development with alkali has been executed as described above. If this modification of the invention consisting in the application of a base layer onto the support is proceeded with, the resin or fatty acid must not necessarily be added to the solution of the diazo compound. Material covered with a base coating consisting of resins soluble in alkalies or high molecular fatty acids and a surface-coating consisting of the diazo compounds here in question can be transformed into excellent printing plates of outstanding quality.

One more object of the present invention is to be seen in a modification of the process which reads as follows:

As soon as the light sensitive material has been exposed to light under a pattern, preferably a positive pattern, it is subjected to the influence of raised temperature, for example by heating it with a flame. This heat-treatment is continued, until the weakly colored copy gets darker and accepts a grayish shade. The copy is then treated with the solution of an alkali in order to remove the light-decomposition products of the diazo compound. After washing with water, the copy is ready for use as printing plate and the plate can be clamped to the printing machine.

It is possible to wash out the light-decomposition product, before the copy is subjected to the heat-treatment. This previous washing out of the light-decomposition products before heating the copy is the better way. After the copy has been heated it can be treated once more with an alkaline solution somewhat stronger than the alkaline solution for the first alkaline treatment. This second treatment with alkali is intended to remove remainders of the light-decomposition products if any. Then the copy is rubbed in with greasy ink.

Instead of heating the exposed material with a flame, it can be heat-treated in an adequate manner by means of a hot flatiron or by means of heated cylinders or by leaving the material for some time in an electrically heated closed chamber. Under the influence of heat the diazo compound is decomposed and the heat-decomposition product is strongly bonded to the support. After the complete removal of the light-decomposition products etching of the heated copy is possible and clichés can thus be manufactured.

In some cases the printing plates which have been manufactured without the addition of resins or fatty acids are fit for the production of only a relatively small number of prints. This circumstance can probably be explained as follows: Some of the diazo compounds to be used according to this invention stick badly to the support if applied without additional substances. When exposed to the strains connected with the printing operation they lose the connection with the support very soon. Generally this disadvantage can be cured by a heat-treatment of the copy as described above.

The observations which could be made are believed to entitle to the conclusion that those diazo compounds into which only a small residue is introduced by means of the esterification process have a bad connection to the support. Diazo compounds in which the said residue is a bigger one and has an annular constitution stick per se much better to their support and afford printing plates of a long life-time without the addition of resins or fatty acids.

A further improvement of the sticking of the greasy ink to the developed printing plates can be reached, if the developed copies, after being rubbed in with greasy ink, are stored for some time, before the printing operation is started. A similar proposal has already been made with respect to printing plates containing bichromates.

The plates and foils serving as support for the light sensitive layer can be coated on an industrial scale in view of the excellent stability of the light sensitive layers. An enormous progress in the graphic art and an unexpected facility for the lithographer has been realized by the present invention.

The following examples are inserted merely for the purpose of illustrating the above described process without any intention of restricting the scope of the invention.

(1) A 2% solution of the condensation product of 2-diazo-naphthol-(1)-5-sulfochloride and 1-benzoyl-amino-5-hydroxynaphthalene (Formula 1) in dioxane (diethylenedioxide) is spread upon a superficially oxidized aluminium foil by means of a plate-whirler making 100 revolutions per minute. After drying by means of hot air (fan), the layer is exposed to light under a positive pattern, after the pattern has been removed, treated with a 3 to 5% trisodium phosphate solution and rinsed with water. Then the foil is well dried with a fan, treated with a 5% phosphoric acid solution as usual and rubbed in with black greasy ink. The yellow diazo image is blackened in this manner. After rinsing with water, the foil in wet state is clamped to the printing apparatus. A modification of the proceeding as described heretofore consists in clamping the printing plate, after it has been treated with acid and rinsed with water, to the printing machine and then rubbing it in with black greasy ink and printing.

The diazo compound named above is prepared as follows: The solution of 5.3 g. of 1-benzoylamino-5-hydroxynaphthalene in 40 ccm. of dioxane and 20 ccm. of water is mixed with a solution of 6 g. of 2-diazo-naphthol-(1)-5-sulfochloride. To this mixture 25 ccm. of a 10% soda solution are slowly added at about 50 to 60° C., until the alkaline reaction is maintained. On cooling a heavy oil is separated which solidifies on addition of some water and of 5 ccm. of a 10% caustic soda solution. The yellow substance is rubbed with water and washed, until it reacts neutral. After drying, it can be used for the purpose of this invention. It is supposed to correspond with the Formula 1.

In the same manner an analogously constituted yellow diazo compound can be prepared from naphthoquinone-(1,2), diazide-(2)-4-sulfochloride and 1-benzoyl-amino-5-hydroxynaphthalene (Formula 2)—after recrystallization from watery dioxane the diazo compound decomposes at about 225° C. when cautiously heated—and can be used alike. Using 2-diazo-naphthol-(1)-5-sulfochloride and 2-benzoylamino-8-hydroxynaphthalene or 2-acetylamino-8-hydroxynaphthalene as reaction components analogous diazo compounds (Formula 3 and Formula 4) are obtained and can be used for the production of printing plates.

(2) In a manner analogous to the method described in Example 1 the condensation product of 2-hydroxychrysene and naphthoquinone-(1,2)-diazide-(2)-5-sulfochloride (Formula 5) is prepared. After recrystallization from dioxane the yellow substance begins sintering and decomposing gradually. It can be used for the manufacture of printing plates and the copies are developed by means of a 3% solution of trisodium phosphate.

(3) 2 parts by weight of the condensation product of naphthoquinone - (1,2) - diazide-(2)-5 - sulfochloride and phenol—the condensation product, which corresponds to Formula 6, is obtained in the usual manner and after recrystallization from methanol in the presence of animal charcoal it melts at 133 to 135° C. under decomposition—are dissolved, together with 0.2 part by weight of thiourea, in 100 parts by volume of dioxane and just as much glycol monomethylether. This solution is whirled on a superficially oxidized aluminum plate by means of a plate-whirler or rubbed on with the aid of a cotton swab and the layer thus produced is dried with the aid of a fan. The coated plate is exposed under a positive pattern, developed by an aqueous solution containing 5% of disodium phosphate and 5% of trisodium phosphate and washed with water. A positive diazo image is obtained which can be used as printing plate, after it has been treated with a solution of acid salts as described, for example, by Strecker in the German Patent No. 642,782, or diluted phosphoric acid (1% content). Preferably the printing plate is stored for some time before it is used, and the greasy ink has the opportunity of joining strongly with the diazo layer.

(4) The ester which has been prepared by condensing 2-acetylamino - 8 - hydroxynaphthalene and 2-diazo-naphthol-(1)-5-sulfochloride (Formula 7) is dissolved in a mixture of dioxane and methyl-ketone (1:1), and a 2% solution is applied onto a superficially oxidized aluminium foil in the same manner as described in Example 1. The further procedure is the same as in Example 1 with the modification that the copy is developed with a 10% disodium phosphate solution and the layer is treated with an 1% phosphoric acid before printing. It is possible, however, to rub in the layer exposed to light under a positive with a black greasy ink, then to powder it with talcum and finally to develop it with a 10% disodium phosphate solution. At once a black image on a light background is formed, from which prints can be made, after it has been treated with a 1% phosphoric acid and rinsed with water.

(5) A 2% solution of the condensation product of 3-benzoyl-amino-1-phenol and naphthoquinone-(1,2)-diazide-(2)-5-sulfochloride (Formula 8) in a mixture of dioxane and methylethylketone (1:1) is prepared. A superficially oxidized aluminium plate or a zinc plate are coated with the solution and can be proceeded with in the same manner as described in Example 1. Care must be taken, however, that the zinc plate, after it has been developed by means of a 5% trisodium phosphate solution, is treated not with phosphoric acid, but with a solution of acid salts as described, for example, by Strecker in the German Patent No. 642,782.

The above mentioned condensation product of 3-benzoylamino-1-phenol and naphthoquinone-(1,2)-diazide-(2)-5-sulfochloride can be prepared in a manner analogous to the method described in Example 1 for the preparation of the condensation product there in question. The condensation product decomposes at about 158° C. after recrystallization from dioxane diluted with some water.

(6) 2 parts by weight of the condensation product of 1 mol of naphthoquinone-(1,2)-diazide-(2)-5-sulfochloride and 1 mol of N-methyl-2-hydroxycarbazol (Formula 9) are dissolved in 100 parts by weight of dioxane and the solution is used for coating a superficially oxidized aluminium plate in the same manner which has been described in Example 1. After the light sensitized plate has been exposed to light under a positive it is rubbed in on its exposed surface with greasy ink, powdered with talcum and developed with a 5% trisodium phosphate solution. A positive image is obtained and the plate can now be prepared for printing in the usual manner.

(7) In the same manner as has been described in Example 1 the condensation product of 2-diazo-naphthol-(1)-5-sulfochloride and 3-hydroxy-diphenyleneoxide (Formula 10) can be used for the manufacture of a printing plate.

(8) A mixture consisting of 1 part by weight of the condensation product of the sulfochloride of naphthoquinone-(1,2)-diazide-(2)-5 - sulfonic acid and 2,4 - dichlorophenol (Formula 11) and 1 part by weight of the condensation product of the sulfochloride of the same sulfonic acid and N-methylaniline is dissolved in 100 parts by volume of a mixture consisting of 2 parts of dioxane and 1 part of alcohol. The solution is plate-whirled onto a superficially oxidized aluminium plate and dried. After it has been exposed to light under a positive, it is developed with a 5% disodium phosphate solution. Then it is made ready for use.

(9) A 2% dioxane-alcohol (1:1) solution of the condensation product of naphthoquinone-(1,2)-diazide-(2)-5-sulfochloride and $\beta$-naphthol (Formula 12) which has been prepared by a condensation in the usual manner, is plate-whirled onto a superficially oxidized aluminium plate. After drying and exposing the plate under a positive, the plate is developed using a 10% disodium phosphate solution and washed with water. After drying, the diazo image is wiped over with a solution of acid salts as described, for example, by Strecker in the German Patent No. 642,782, or with a 1% phosphoric acid, treated in the wet state with greasy ink, rinsed with water and dried. After it has been stored overnight, the printing plate is treated with phosphoric acid once more, washed with water and used for printing in a printing machine.

(10) A glycol monomethylether solution is made by dissolving per 100 ccm. of glycolmonomethylether 2 grs. of 2-diazonaphthol-(1)-5-sulfonic acid-$\alpha$-naphthylester (Formula 13) and 0.6 gr. of stearic acid. This light sensitive solution containing stearic acid is applied onto a superficially oxidized aluminium plate by means of a plate-whirler. After drying, the light-sensitive layer is exposed to light under a positive pattern. The plate is then washed with a 5% trisodium phosphate solution, subsequently washed with water and dried. The dried developed plate is treated with a 1% phosphoric acid or with a solution of acid salts as described, for example, by Strecker in the German Patent No. 642,782, and the positive image is developed with greasy ink.

The naphthoquinone-(1,2)-diazide-(2)-5-sulfonic acid-$\alpha$-naphthylester corresponding with Formula 13 is prepared as follows:

To a solution of 3 grs. of $\alpha$-naphthol (crystals) in 20 cc. of dioxane there are added a solution of 5.4 grs. of naphthoquinone-(1,2)-diazide-(2)-5-sulfochloride in 25 ccm. of dioxane and subsequently 15 cc. of a 10% sodium carbonate solution. The mixture is gradually warmed to 35° C., then cooled down and made alkaline by addition of sodium hydroxide. The precipitate formed is filtered off by suction, washed with water and dried. The sulfonic-acid-α-naphthylester formed melts at 148° C. with decomposition.

(11) A printing plate is produced in the same manner as described in Example 10, but instead of the α-naphthylester cited in Example 10, the phenylester of 2-diazo-naphthol-(1)-5-sulfonic acid (Formula 6) and instead of 0.6% of stearic acid 0.4% of shellac—calculated on the total volume of the solution—are used.

(12) A 0.5% solution of shellac is coated onto a superficially oxidized aluminium foil with the aid of a plate-whirler and dried. This coating is covered with another thin layer which is produced by means of a 2% solution of 2-diazo-naphthol-(1)-5-sulfonic acid-α-naphthylester (Formula 13) in glycol monomethylether, the solution containing also 0.3% of stearic acid. The coated foil is exposed to light under a pattern and washed with a 5% trisodium phosphate solution and subsequently with water. The coated surface of the dried material is then treated with a 1% phosphoric acid solution and the image while still wet is rubbed in with greasy ink as usual.

(13) 2 g. of the condensation product of 2-hydroxy-fluorene and naphthoquinone-(1,2)-diazide-(2)-5-sulfo-chloride (Formula 14) as well as 0.5 g. of an ortho-cresol-formaldehyde resin manufactured in accordance with the data of the German Patent No. 281,454 are dissolved together in 100 g. of dioxane. The solution is spread on a superficially oxidized aluminium foil or a zinc plate and the solvent is then removed by the action of hot air, for example with the aid of a fan, or by storing the foil for some time. The light-sensitive layer when dry is exposed to light under a positive pattern and the diazo image is developed by means of a 3% trisodium phosphate solution, rinsed with water, and, after it has been cleaned with a 1% phosphoric acid solution or a solution of acid salts as described, for example, by Strecker in the German Patent No. 642,782, rubbed in with greasy ink, while still in the wet state. The foil is then rinsed with water and the wet foil is clamped to the printing machine.

It is also possible to treat the foil with an acid and to wash it and then to rub it in with greasy ink, after it has been clamped to the printing machine.

The compound corresponding to Formula 14 is produced by adding to the solution of 1.8 g. of 2-hydroxy fluorene in a mixture consisting of 20 cc. of dioxane and 10 cc. of water at room temperature the solution of 3 g. of naphthoquinone-(1,2)-diazide-(2)-5-sulfochloride in 20 cc. of dioxane, and then, while gradually heating the mixture to 40° C., 15 cc. of a 10% solution of sodium carbonate. A yellow crystalline compound separates which is filtered off by suction, washed with a mixture of equal parts by volume of dioxane and water, subsequently with water only and then dried. The compound melts at 163° C. with decomposition.

(14) A 1% solution of the phenylester of 2-diazo-naphthol-(1)-5-sulfonic acid (Formula 6) in alcohol, to which solution a small quantity of thiosinamine has been added, is applied onto an oxidized aluminium foil in the usual manner. The coated foil is exposed to light under a pattern, washed with a 5% trisodium phosphate solution, rinsed with water and heated on its backside by means of a flame until the positive image becomes gray. After the foil has then been treated with a trisodium phosphate solution once more, the printing plate is finished in the usual manner.

The phenyl ester of 2-diazo-naphthol-(1)-5-sulfonic acid is prepared in accordance with the method described by M. Georgescu in "Berichte der Deutschen Chemischen Gesellschaft," vol. 24 (1891), page 416, by causing 2-diazo-naphthol-(1)-5-sulfochloride to react with phenol in a weakly alkaline solution. The phenyl ester obtained can be purified by recrystallization from methanol; it decomposes at 143° C.

(15) 2 parts by weight of the 2-diazo-naphthol-(1)-4-sulfonic acid-p-tolylester (Formula 15) are dissolved in a mixture consisting of 50 parts by weight of dioxane (diethylenedioxide) and 50 parts by weight of alcohol. The solution is applied as usual onto a superficially oxidized aluminium foil and well dried. The light sensitive layer produced in this manner is exposed to light under a positive pattern, until the diazo compound has been destroyed under the high-light areas of the positive pattern. Subsequently the layer is treated with a 5% aqueous trisodium phosphate solution, rinsed with water and dried. Now the foil is heated as long as the yellow positive diazo image has a grayish-olive color tone. The foil is subsequently cleaned with the solution of acid salts as described, for example, by Strecker in the German Patent No. 642,782, or a 1% phosphoric acid solution. It is washed with water and while still wet clamped to the printing machine. It is possible to cover the image with a coating of gum in order to store the printing plate. Before printing the gum coating is washed off with water and the printing plate is ready for use.

The tolylester of 2-diazo-naphthol-(1)-4-sulfonic acid can be prepared, analogously to the phenyl ester, by slightly heating 1 mol of 2-diazo-naphthol-(1)-5-sulfochloride in the presence of 1 mol of p-cresol in an aqueous solution of dioxane. A 10% soda solution is slowly added to the reaction mixture, until the alkaline reaction has become permanent.

Using the p-nitrophenylester of 2-diazo-napthol-(1)-4-sulfonic acid (Formula 16) printing plates can be manufactured in a similar manner. In this case it is necessary, however, to develop the diazo image with a 3% trisodium phosphate solution.

(16) 1.3 g. of 6-hydroxy-quinoline are dissolved in 10 cc. of dioxane and 5 cc. of water, and to this solution a solution of 2.7 g. of naphthoquinone-(1,2)-diazide-(2)-5-sulfochloride in 15 cc. of dioxane is added. While heating up to 40° C., 12 cc. of a 10% sodium carbonate solution are added. After half an hour the reaction mixture is allowed to cool down, whereupon part of the yellow condensation product separates. By addition of water it is completely precipitated, sucked off, washed with water and dried at a temperature of 40° C. By recrystallization from alcohol with some animal charcoal more yellow crystals are obtained (the product of Formula 17) which decompose when heated to 195° C. approximately.

A 1.5% solution of this diazo compound in glycol monomethylether is coated as usual upon a roughened aluminium foil by means of a plate-whirler, whereupon the foil is thoroughly dried. It is then exposed under a transparent positive master. Development is effected by means of 1% phosphoric acid and results in a negative image of the original. Inking with greasy ink follows.

The development of the exposed foil can also be effected by means of a 10% aqueous solution of disodium phosphate. In this case the development results in a positive image of the positive original and the printing plate obtained is a positive one. The inking operation may follow immediately upon the development, treatment of the developed foil with dilute phosphoric acid is dispensable. It is also possible to apply the alkaline developer and the greasy ink simultaneously to the exposed foil.

(17) 1.45 g. of β-napthol dissolved in 10 cc. of dioxane are added to a solution of 3.1 g. of 8-chloronaphthoquinone-(1,2)-diazide-(2)-5-sulfochloride in 15 cc. of dioxane. To this mixture 10 cc. of a 10% sodium carbonate solution are slowly added while heating the mixture to 40° C. After about 10 minutes the temperature is raised to 60° C. and pretty soon a thick crystalline mass separates. The reaction mixture is cooled down and by adding about 50 cc. of water all of the condensation product (Formula 18) is precipitated. The yellow colored condensation product is sucked off, washed with water and then dried at 40° C. By recrystallizing the product from benzene yellow crystals are obtained which decompose at about 158° C.

A 1.5% solution of this compound in glycol monomethyl ether is coated on a roughened aluminium plate by means of a plate whirler. The coated foil is well dried and then exposed under a transparent positive pattern. A positive image is obtained by developing the exposed foil with a 10% disodium phosphate solution or a 1% trisodium phosphate solution.

The 8-chloro-naphthoquinone-(1,2)-diazide-(2)-5-sulfonic acid is prepared as follows:

8-chloro-1-naphthol-5-sulfonic acid sodium salt is dissolved in hot water, mixed with hydrochloric acid and in known manner transformed into a nitroso compound by reacting it with a 2 n-sodium nitrite solution at a temperature of +5 to +10° C. The solution turns yellow and after some time the nitroso compound precipitates in the form of yellow crystals. The nitroso compound is drawn off, suspended in water and then reduced by means of an aqueous solution of disodium sulfide; the temperature may be up to 40° C. The compound which precipitated through acidification of the reaction mixture with hydrochloric acid is then sucked off and diazotized in an aqueous suspension with copper sulfate and sodium nitrite. The diazo compound is salted out with sodium chloride, again dissolved in water, freed from sulfur by filtration, and finally salted out again.

The 8-chloro-naphthoquinone-(1,2)-diazide-(2)-5-sulfonic acid thus obtained is yellow and can be coupled with phloroglucinol to a violet azo dye.

The 8-chloro-naphthoquinone-(1,2)-diazide-(2)-5-sulfochloride is prepared in known manner by introducing the corresponding sulfonic acid into chlorosulfonic acid. The chloride is formed after a longish heating to 50° C. After precipitation by means of ice the chloride is sucked off, washed and dried. It can be recrystallized from benzene and decomposes when heated to 151° C.

4 g. of 4-isooctylphenol dissolved in 20 cc. of dioxane are added to a solution of 7 g. of naphthoquinone-(1,2)-diazide-(2)-5-sulfochloride in 35 cc. of dioxane. The esterification is brought about by adding a 10% soda solution. Towards the end of the esterification process the temperature is raised to 50° C. The reaction mixture is then stirred into twice its volume of dilute hydrochloric acid. The precipitating yellow diazo compound (Formula 19) is drawn off and washed neutral with water. It is recrystallized from methanol and decomposes when heated to 148° C.

A 2% solution of the naphthoquinone-(1,2)-diazide-(2)-5-sulfonic acid ester of isooctylphenol in glycol monomethylether is coated on a roughened aluminum foil by means of a plate whirler and the coating is then well dried. The sensitized foil is exposed under a transparent positive pattern. By development of the exposed foil with a 5% disodium phosphate solution a positive image is obtained. After rinsing the developed foil with water, treating it with 1% phosphoric acid and inking it with greasy ink, the foil may be used for printing.

18. A solution containing 1.5 g. of the diazo compound corresponding to Formula 20 in 100 cc. of a 1:1 mixture of ethyleneglycol monomethylether and dimethylformamide is applied to a brushed aluminum foil by means of a plate whirler and then dried with warm air. After exposure of the light sensitive layer thus prepared under a positive pattern, the exposed layer is developed with a 5% aqueous solution of trisodium phosphate, rinsed with water and finally wiped over with an aqueous solution containing 14% of gum arabic and 0.6% of phosphoric acid. The foil treated in this manner is inked with greasy ink and may now be used as a positive printing plate.

The compound corresponding to Formula 20 is prepared as follows:

85 g. of naphthoquinone-(1,2)-diazide-(1)-8-sulfonic acid (for the preparation of this compound see: Friedländer, "Teerfarbenfabrikation," vol. 8, pages 641–644), are given into 430 ml. of chlorosulfonic acid, while the temperature rises to about 30° C. The reaction mixture is heated up to 100° C. over a period of 30 minutes and then agitated at this temperature for another 30 minutes. While the reaction mixture cools down, water and ice are added, whereupon the naphthoquinone-(1,2)-diazide-(1)-8-sulfochloride separates. The precipitate is drawn off, washed and then dried at 50° C. Upon recrystallization from the benzene the compound precipitates as a yellow substance which melts at 145° C. with decomposition.

6.8 g. of eosine S (see Schultz: "Farbstofftabellen," 7th edition, 1931, vol. I, No. 883), are dissolved in a mixture consisting of 50 ml. of dioxane, 15 ml. of water and 10 ml. of a 10% sodium carbonate solution. To this solution there is added a warm (about 40° C.) solution containing 3 g. of naphthoquinone-(1,2)-diazide-(1)-8-sulfochloride in 25 ml. of dioxane. While adding 15 ml. of a 10% sodium carbonate solution the reaction mixture is heated to about 50° C., whereupon condensation occurs. After about 1 hour the compound corresponding to Formula 20 a red condensation product, precipitates. The reaction mixture is heated for 15 minutes to 60–70° C. and then water is added until precipitation has finished. The liquid is then drawn off while hot, and the filtration residue is washed first with hot water, then twice with dilute sodium carbonate solution in order to remove the unreacted eosine. Finally the residue is washed neutral and dried at 50° C.

This application is a continuation-in-part of application Serial No. 472,224, filed Nov. 30, 1954, which is, in turn, a continuation-in-part of application Serial No. 174,556, filed July 18, 1950, and now abandoned.

What is claimed is:

1. A compound having the formula

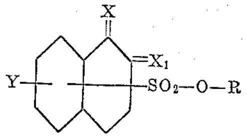

in which X and $X_1$ are selected from the group consisting of $N_2$ and O and are different Y is selected from the group consisting of hydrogen and halogen and R is an aryl group.

2. A compound having the formula

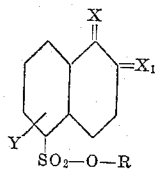

in which X and $X_1$ are selected from the group consisting of $N_2$ and O and are different, Y is selected from the group consisting of hydrogen and halogen and R is an aryl group.

3. A compound having the formula

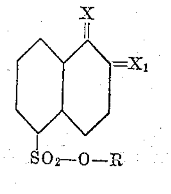

in which X and $X_1$ are selected from the group consisting of $N_2$ and O and are different and R is an aryl group.

4. A compound having the formula

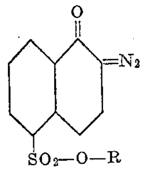

in which R is a naphthyl group.

5. A compound having the formula

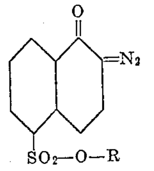

in which R is a phenyl group.

6. A compound having the formula

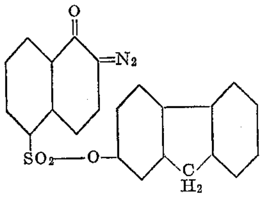

7. A compound having the formula

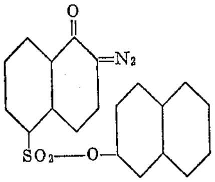

8. A compound having the formula

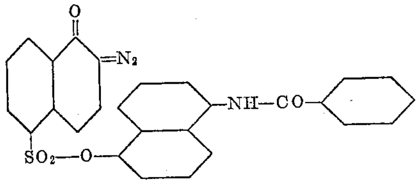

9. A compound having the formula

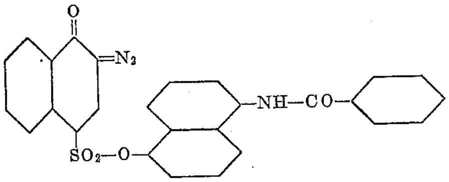

10. A printing plate comprising a base material having printing and non-printing areas thereon, the printing areas comprising a compound having the formula

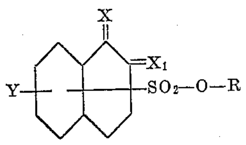

in which X and $X_1$ are selected from the group consisting of $N_2$ and O and are different, Y is selected from the group consisting of hydrogen and halogen and R is an aryl group.

11. A printing plate comprising a base material having printing and non-printing areas thereon, the printing areas comprising a compound having the formula

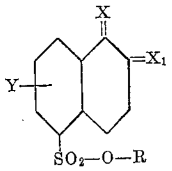

in which X and $X_1$ are selected from the group consisting of $N_2$ and O and are different, Y is selected from the group consisting of hydrogen and halogen and R is an aryl group.

12. A printing plate comprising a base material having printing and non-printing areas thereon, the printing areas comprising a compound having the formula

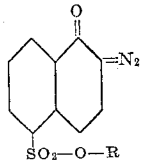

in which R is a naphthyl group.

13. A printing plate comprising a base material having printing and non-printing areas thereon, the printing areas comprising a compound having the formula

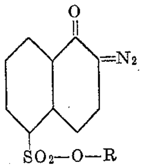

in which R is a phenyl group.

14. A printing plate comprising a base material having printing and non-printing areas thereon, the printing areas comprising a compound having the formula

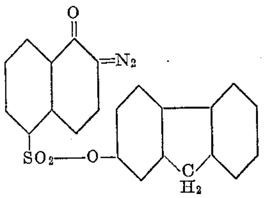

15. A printing plate comprising a base material having printing and non-printing areas thereon, the printing areas comprising a compound having the formula

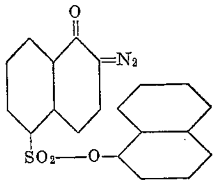

16. A printing plate comprising a base material having printing and non-printing areas thereon, the printing areas comprising a compound having the formula

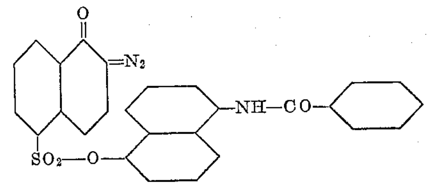

17. A printing plate comprising a base material having printing and non-printing areas thereon, the printing areas comprising a compound having the formula

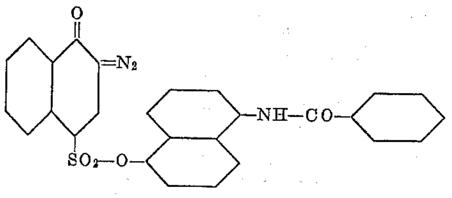

18. A process for developing a printing plate which comprises exposing to light under a master a plate having a compound thereon of the formula

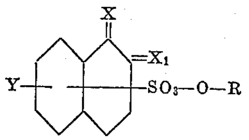

in which X and $X_1$ are selected from the group consisting of $N_2$ and O and are different,
Y is selected from the group consisting of hydrogen and halogen and
R is an aryl group to thereby form a decomposition product in the light struck areas and removing the decomposition product by treatment with a weakly alkaline solution.

19. A process for developing a printing plate which comprises exposing to light under a master a plate having a compound thereon of the formula

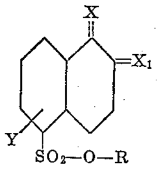

in which X and $X_1$ are selected from the group consisting of $N_2$ and O and are different,
Y is selected from the group consisting of hydrogen and halogen and
R is an aryl group, to thereby form a decomposition product in the light struck areas and removing the decomposition product by treatment with a weakly alkaline solution.

20. A process for developing a printing plate which comprises exposing to light under a master plate having a compound thereon of the formula

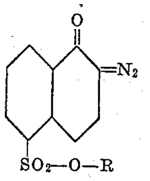

in which R is a naphthyl group, to thereby form a decomposition product in the light struck areas and removing the decomposition product by treatment with a weakly alkaline solution.

21. A process for developing a printing plate which comprises exposing to light under a master a plate having a compound thereon of the formula

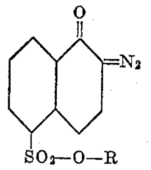

in which R is a phenyl group, to thereby form a decomposition product in the light struck areas and removing the decomposition product by treatment with a weakly alkaline solution.

22. A process for developing a printing plate which comprises exposing to light under a master a plate having a compound thereon of the formula

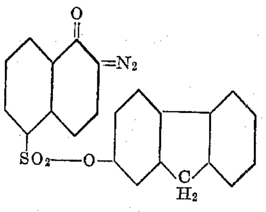

to thereby form a decomposition product in the light struck areas and removing the decomposition product by treatment with a weakly alkaline solution.

23. A process for developing a printing plate which comprises exposing to light under a master a plate having a compound thereon of the formula

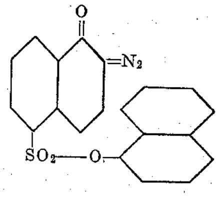

to thereby form a decomposition product in the light struck areas and removing the decomposition product by treatment with a weakly alkaline solution.

24. A process for developing a printing plate which comprises exposing to light under a master a plate having a compound thereon of the formula

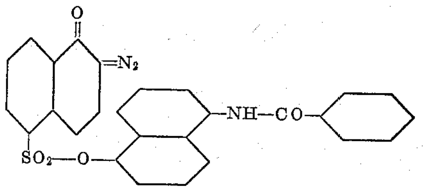

to thereby form a decomposition product in the light struck areas and removing the decomposition product by treatment with a weakly alkaline solution.

25. A process for developing a printing plate which comprises exposing to light under a master a plate having a compound thereon of the formula

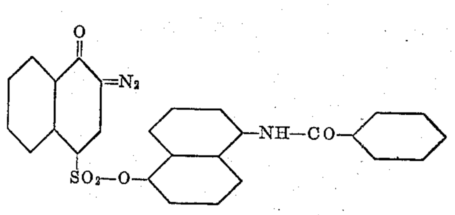

to thereby form a decomposition product in the light struck areas and removing the decomposition product by treatment with a weakly alkaline solution.

26. A compound having the formula

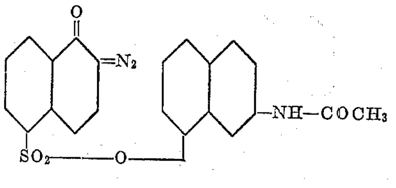

27. A compound having the formula

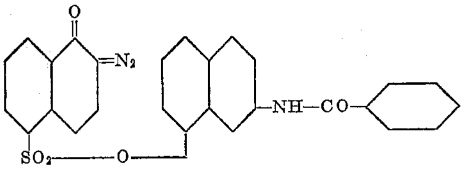

28. A compound having the formula

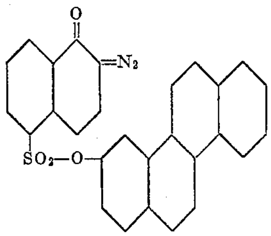

29. A compound having the formula

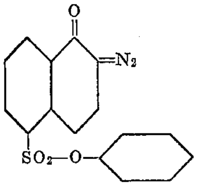

30. A compound having the formula

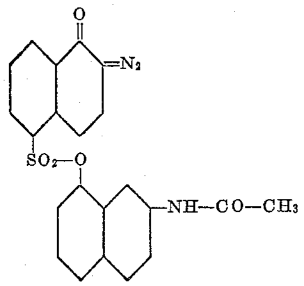

31. A compound having the formula

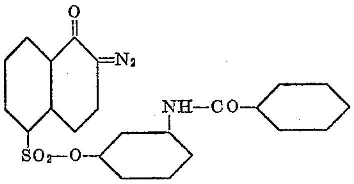

32. A compound having the formula

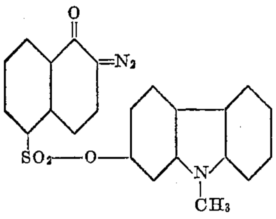

33. A compound having the formula

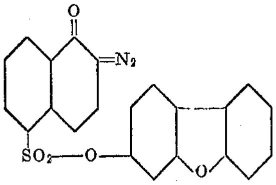

34. A compound having the formula

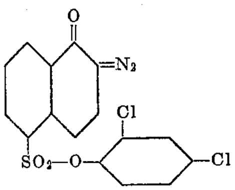

35. A compound having the formula

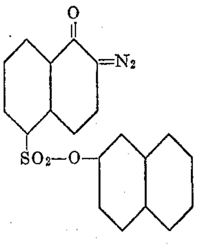

36. A compound having the formula

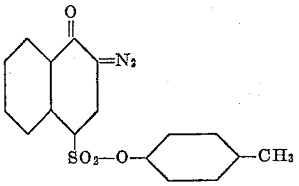

37. A compound having the formula

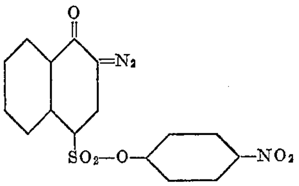

38. A compound having the formula

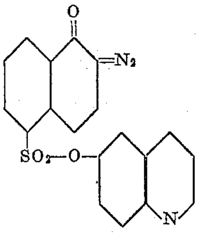

39. A compound having the formula

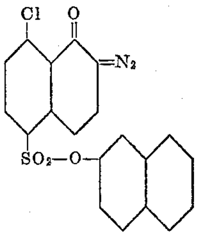

40. A compound having the formula

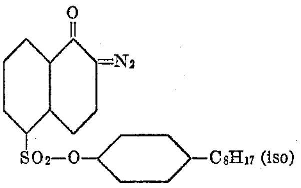

41. A compound having the formula
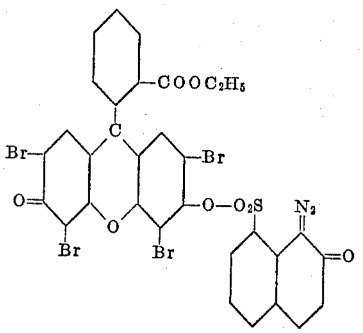
42. A process according to claim 18 in which the compound is in admixture with an alkali-soluble resin.
References Cited in the file of this patent
UNITED STATES PATENTS
| | | |
|---|---|---|
| 2,702,243 | Schmidt | Feb. 15, 1955 |
FOREIGN PATENTS
| | | |
|---|---|---|
| 904,255 | France | Feb. 19, 1945 |
| 865,108 | Germany | Jan. 29, 1953 |
| 872,154 | Germany | Mar. 30, 1953 |
OTHER REFERENCES
P.B. 17547–S3, abstract of German application K 169,065 released July 28, 1947, 10 pages.